United States Patent

Takata

[11] Patent Number: 4,759,978
[45] Date of Patent: Jul. 26, 1988

[54] EPOXY RESIN COMPOSITION

[75] Inventor: Toshimasa Takata, Ichihara, Japan

[73] Assignee: Mitsui Petrochemical Industries, Ltd., Tokyo, Japan

[21] Appl. No.: 912,549

[22] Filed: Sep. 29, 1986

[30] Foreign Application Priority Data

Sep. 30, 1985 [JP] Japan ................. 60-214821

[51] Int. Cl.$^4$ .................. C08G 59/02; C08G 59/62
[52] U.S. Cl. ..................... 428/290; 428/273;
528/98; 528/102; 528/104
[58] Field of Search .............. 528/102, 104, 98;
428/290, 273

[56] References Cited

U.S. PATENT DOCUMENTS

| | | | |
|---|---|---|---|
| 4,302,574 | 11/1981 | Doorakian et al. | 528/365 X |
| 4,594,291 | 6/1986 | Bertram et al. | 528/98 X |
| 4,604,317 | 8/1986 | Berman et al. | 528/98 X |
| 4,612,156 | 9/1986 | Heinemeyer et al. | 528/98 X |

*Primary Examiner*—Earl Nielsen
*Attorney, Agent, or Firm*—Sherman and Shalloway

[57] ABSTRACT

A novel epoxy resin composition is obtained by modifying a bisphenol-type epoxy resin and/or a halogen-containing epoxy resin with a trisphenol represented by the following general formula:

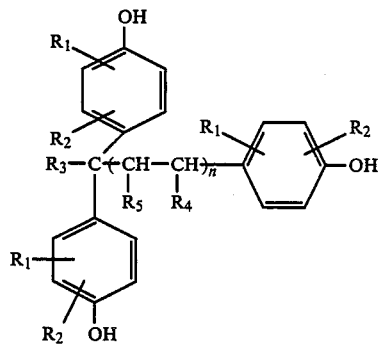

wherein each of $R_1$ and $R_2$ represents hydrogen or an alkyl group havng not more than 6 carbon atoms with the proviso that at least one of them is the alkyl group, each of $R_3$, $R_4$ and $R_5$ represents hydrogen or an alkyl group having not more than 4 carbon atoms, and n represents a number of 0 or 1. The composition is suitable, for example, as a paint, a casting material or a molding material.

10 Claims, No Drawings

EPOXY RESIN COMPOSITION

BACKGROUND OF THE INVENTION

1. Field of the Invention

This invention relates to an epoxy resin composition, and more specifically, to an epoxy resin composition which has excellent properties, above all high water resistance, chemical resistance and heat resistance, and is suitable for use as a paint, a casting material and a molding material for making laminated plates.

2. Description of the Prior Art

It has been known that compositions comprising bisphenol A-type epoxy resins or halogen-containing bisphenol A-type epoxy resins and curing agents such as aromatic polyamines, amine adducts, dicyandiamide, acid anhydrides or phenol novolak resins are used as paints, molding materials and casting materials, and such compositions may be formed in varnishes by using solvents to use them for molding laminated plates by impregnation in reinforcing substrates.

In recent years, insulating paints, encapsulating materials and laminated plates (printed circuit boards) in electrical and electronic component parts have required increased heat resistance in order to increase the reliability of mechanical properties and electrical insulation at high temperatures. Paints, encapsulating materials and laminated plates (printed circuit boards) made from conventional bisphenol A-type epoxy resins or halogen-containing bisphenol A-type epoxy resins have the defect that their glass transition temperature (Tg) is still low, and at high temperatures, their mechanical strength and electrical insulation are reduced. Polyfunctional epoxy resins such as a phenol novolak type epoxy resin or an o-cresol/novolak type epoxy resin are added to the above epoxy resins in order to increase their heat resistance. Use of large amounts of the polyfunctional epoxy resins reduces the heat shock resistance of the above epoxy resin although it does result in an improvement in heat resistance. Consequently, cracking tends to occur in the paints and encapsulating materials. When the laminated plates are treated in a solder bath after boiling treatment, phenomena called "blister", "peel", "measling" and "crazing" are sometimes observed in the laminated plates treated.

It has been strongly desired therefore to provide an epoxy resin composition which does not undergo significant deterioration in mechanical strength and electrical insulation even at high temperatures and has excellent heat shock resistance.

SUMMARY OF THE INVENTION

The present inventor extensively worked on epoxy resins which would be useful in such applications as paints, encapsulating materials and laminated plates, and has now found that products of modification of bisphenol-type epoxy resins and/or halogen-containing epoxy resins with trisphenols of the following general formula:

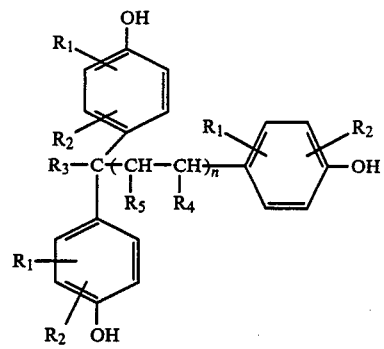

wherein each of $R_1$ and $R_2$ represents hydrogen or an alkyl group having not more than 6 carbon atoms with the proviso that at least one of them is the alkyl group, each of $R_3$, $R_4$ and $R_5$ represents hydrogen or an alkyl group having not more than 4 carbon atoms, and n represents a number of 0 or 1, have excellent mechanical strength and electrical insulation at high temperatures, and retain the advantages of epoxy resins heretofore used.

According to this invention, there is provided a novel epoxy resin composition comprising the reaction product of (A) a compound having three phenolic hydroxyl groups in the molecule represented by the following general formula:

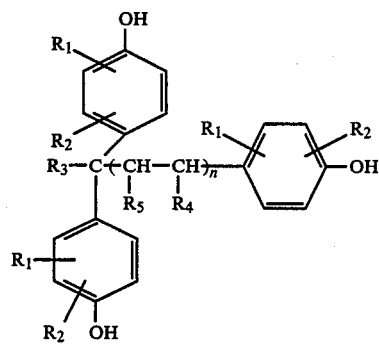

wherein each of $R_1$ and $R_2$ represents hydrogen or an alkyl group having not more than 6 carbon atoms with the proviso that at least one of them is the alkyl group, each of $R_3$, $R_4$ and $R_5$ represents hydrogen or an alkyl group having not more than 4 carbon atoms, and n represents a number of 0 or 1, with (B) a bisphenol-type epoxy resin and/or (C) a halogen-containing epoxy resin, the number of the phenolic hydroxyl groups of the compound (A) being 0.03 to 0.7 per epoxy group of the epoxy resin (B) and/or (C).

According to this invention, there is also provided a laminated plate obtained by consolidating under heat and pressure prepregs composed of a reinforcing fibrous base material and a combination of an epoxy resin and a curing agent impregnated in the base material, said epoxy resin being an epoxy resin composition comprising the reaction product of (A) a compound having three phenolic hydroxyl groups in the molecule represented by the following general formula:

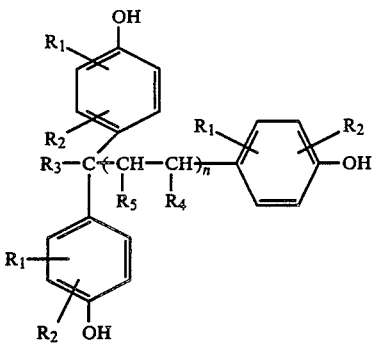

wherein each of $R_1$ and $R_2$ represents hydrogen or an alkyl group having not more than 6 carbon atoms with the proviso that at least one of them is the alkyl group, each of $R_3$, $R_4$ and $R_5$ represents hydrogen or an alkyl group having not more than 4 carbon atoms, and n represents a number of 0 or 1, with (B) a bisphenol-type epoxy resin and/or (C) a halogen-containing epoxy resin, the number of the phenolic hydroxyl groups of the compound (A) being 0.03 to 0.7 per epoxy group of the epoxy resin (B) and/or (C), and said laminate having a glass transition temperature (Tg), measured by a differential scanning calorimeter, of at least 150° C.

DETAILED DESCRIPTION OF THE INVENTION bisphenol-type epoxy resin (B)

Various bisphenol-type epoxy resins known per se, such as bisphenol A epoxy resin and bisphenol F epoxy resin, are used as the bisphenol-type epoxy resin (B) in the epoxy resin composition of this invention. For example, bisphenol-type epoxy resins derived from bisphenols such as 1,1-bis(4-hydroxyaryl)ethanes or 1-aryl-1,1-bis(4-hydroxyaryl)ethanes may also be used. Preferably, a bisphenol A-type epoxy resin obtained by reacting bisphenol A with epichlorohydrin can be used. Most preferably, the bisphenol A-type epoxy resin which has an epoxy equivalent of 170 to 500 is used.

Halogen-containing epoxy resin (C)

Various halogen-containing epoxy resins known per se can be used as the halogen-containing epoxy resin (C). Preferred are bromine-containing bisphenol A-type epoxy resins. Those having a bromine content of 30 to 50% by weight, especially 40 to 50% by weight, and an epoxy equivalent of 328 to 2,000, especially 328 to 800, are preferred.

Most preferably, there is used a bromine-containing bisphenol A-type epoxy resin of the following chemical formula:

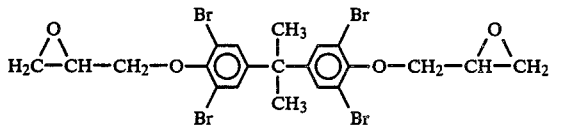

obtained by reacting tetrabromobisphenol A with epichlorohydrin (epoxy equivalent 328, bromine content 48.7%).

For use in an application where flame retardancy is important, the halogen (bromine) content of the final epoxy resin composition is adjusted to 15 to 30% by weight.

trisphenol (A)

In accordance with this invention, the bisphenol-type epoxy resin (B) and/or the halogen-containing epoxy resin (C) is modified with the trisphenol (A) of the following general formula:

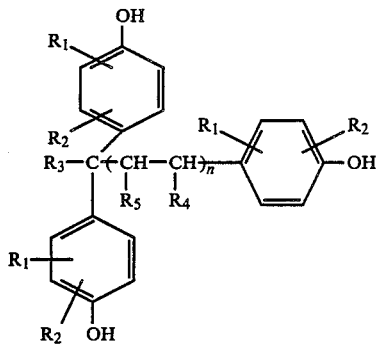

wherein each of $R_1$ and $R_2$ represents hydrogen or an alkyl group having not more than 6 carbon atoms, preferably a methyl, ethyl, isopropyl, t-butyl or 2,2-dimethylbutyl group, with the proviso that at least one of $R_1$ and $R_2$ is the alkyl group; $R_3$ represents hydrogen or an alkyl group having not more than 4 carbon atoms, preferably a methyl or ethyl group; each of $R_4$ and $R_5$ represents an alkyl group having not more than 4 carbon atoms, preferably a methyl, ethyl or isopropyl group; and n is a number of 0 or 1.

Preferred trisphenols (A) of the above general formula, are those in which $R_4$ is a methyl group, and those of the general formula in which $R_4$ is a methyl group and $R_5$ is hydrogen are most preferred. The latter can be obtained by the addition reaction of crotonaldehyde with suitable phenols.

Trisphenols of the above general formula in which $R_4$ and $R_5$ are the alkyl groups such as methyl groups can be obtained generally by the addition reaction of alkylation products of aliphatic unsaturated aldehydes such as methacrolein and crotonaldehyde with suitable phenols.

Examples of the trisphenol (A) are listed below without any intention of limiting the invention thereto.

1,1,1-tris(4-Hydroxyphenyl)methane,
(bis(3,5-dimethyl-4-hydroxyphenyl)-4-hydroxyphenyl)methane,
(bis(3,5-diethyl-4-hydroxyphenyl)-4-hydroxyphenyl)methane,
(bis(2-methyl-4-hydroxy-6-t-butylphenyl)-4-hydroxyphenyl)methane,
(bis(2-ethyl-4-hydroxy-5-t-butylphenyl)-4-hydroxyphenyl)methane,
(bis(3,5-di-t-butyl-4-hydroxyphenyl)-4-hydroxyphenyl)methane,
(bis(3,5-di-iso-propyl-4-hydroxyphenyl)-4-hydroxyphenyl)methane,
1,1,3-tris(4-hydroxyphenyl)propane,
1,1,3-tris(3,5-dimethyl-4-hydroxyphenyl)propane,
1,1,3-tris(3,5-diethyl-4-hydroxyphenyl)propane,
1,1,3-tris(3,5-di-isopropyl-4-hydroxyphenyl)propane,
1,1,3-tris(3,5-di-t-butyl-4-hydroxyphenyl)propane,
1,1,3-tris(2-methyl-4-hydroxy-5-t-butylphenyl)propane,
1,1,3-tris(2-ethyl-4-hydroxy-5-t-butylphenyl)propane, 1,1,3-tris(2-methyl-4-hydroxy-5-isopropylphenyl)propane,
1,1,3-tris(2-ethyl-4-hydroxy-5-isopropylphenyl)propane,
1,1,3-tris(2,5-dimethyl-4-hydroxyphenyl)propane,
1,1,3-tris(2,5-diethyl-4-hydroxyphenyl)propane,
2,2,4-tris(2-methyl-4-hydroxy-5-t-butylphenyl)butane, and
1,1,3-tris(2-methyl-4-hydroxy-5-t-butylphenyl)butane.

The amount of the trisphenol (A) to be reacted with the epoxy resin (B) and/or (C) is such that the number of the phenolic hydroxyl groups of the trisphenol in the final epoxy resin composition is 0.03 to 0.7, preferably 0.05 to 0.6, per epoxy group of the epoxy resin (B) and/or (C). If its amount is below the specified limit, the desired effect cannot be obtained. If it is larger than the specified upper limit, the epoxy equivalent becomes too large and the resulting epoxy resin composition lends itself to inconvenient handling.

The modification reaction is carried out by melting and stirring the reaction materials generally at a temperature of about 120° to 200° C. for about 3 to 20 hours. Preferably, the reaction is carried out in the presence of about 20 to 200 ppm, based on the amount of trisphenol (A) and the epoxy resin (B) and/or (C) used in the reaction, of a catalyst usually employed in the reaction of the epoxy group with the phenolic hydroxyl group, for example a basic catalyst such as sodium hydroxide and sodium carbonate, a quaternary ammonium salt catalyst such as a tetraalkyl ammonium halide and an aralkyl trialkyl ammonium halide, or a phosphine-containing catalyst such as triphenylphosphine and ethyltriphenyl phosphonium halides. As required, a solvent, for example an aromatic hydrocarbon such as toluene and xylene or a ketone such as methyl isobutyl ketone, may be used in the reaction.

Incidentally, when a tris-3,5-dialkyl substituted-4-hydroxyphenyl compound is used as the trisphenol (A), the rate of the reaction tends to decrease because of steric hindrance of the substituents at the 3,5-positions.

Epoxy resin composition

The epoxy resin composition of this invention as a reaction product can be produced by properly selecting the afore-said reaction conditions so that the epoxy resin composition attains an epoxy equivalent of 200 to 1,800, particularly 200 to 900.

If the epoxy equivalent is lower than the limit specified above, the proportion of the trisphenol bonded is small, and the improving effect by the modification is small. If it is higher than the specified limit, the molecular weight of the resin itself becomes high, and as a result, the resulting composition has too high a melt viscosity and lends itself to poor handling. Even when such a composition is formed into a varnish by using a solvent, the varnish has a high solution viscosity and its workability in coating steps is reduced.

The resulting epoxy resin composition of this invention has very good heat resistance at high temperatures, and when used as a paint, a casting material or a molding material for production of laminated plates, is very useful in increasing the reliability of mechanical strength, electrical insulation, etc. at high temperatures.

As required, the epoxy resin composition of this invention may be used in combination with another epoxy resin known per se in an amount which does not impair the purpose of this invention.

For example, it is possible to modify one of the epoxy resins (B) and (C) with the trisphenol (A) in accordance with this invention, and to use the modified epoxy resin in combination with the other of the epoxy groups (B) and (C).

Of course, the epoxy resin composition may be used in combination with any of other epoxy resin such as phenol novolak-type resin and ortho-cresol novolak type epoxy resin.

The epoxy resin composition of this invention can be used in the form of a mixture with a curing agent known generally for ordinary epoxy resins, such as an aliphatic amine, an aromatic amine, an amine adduct, dicyandiamide or an acid anhydride in the production of an electrical insulating paint, a casting material, an encapsulating material, a laminated plate.

The amount of the curing agent used, which varies depending upon the type of the curing agent, is generally about 2 to 40 parts by weight per 100 parts of the epoxy resin composition.

Laminated plate

For use in producing a laminated plate, the epoxy resin composition containing the curing agent is generally formed into a varnish by using a solvent, for example, an aromatic hydrocarbon such as toluene or xylene or a ketone such as acetone, methyl ethyl ketone or methyl isobutyl ketone. The epoxy resin composition as varnish is then impregnated into reinforcing base materials such as glass cloths, carbon fibers, glass fibers, paper, asbestos, polyester fibers or aromatic polyamide fibers (e.g., Kevlar (tradename)) to form prepregs. The prepregs are then consolidated under heat and pressure to produce a laminated plate.

The laminated plate of the invention after curing has the advantage that it has a high heat distortion temperature, a high glass transition temperature, improved mechanical strength and electrical insulation at high temperatures, and excellent water resistance as compared with a general bisphenol A-type epoxy resin or bromine-containing epoxy resin while the desirable advantages of the general epoxy resins are retained.

For example, as shown in a working example to be given hereinafter, the laminated plate has a glass transition temperature (Tg) of at least 150° C.

Other uses

For use as a paint, the epoxy resin composition of this invention is mixed with, for example, a coloring agent (pigment), a filler, a solvent, and a defoamer. Various fillers may be used when the epoxy resin composition of this invention is to be used as a casting material.

The paint or casting material likewise has improved mechanical strength and electrical insulation at high temperatures and excellent water resistance.

EXAMPLE 1

| | |
|---|---|
| bisphenol A-type epoxy resin (epoxy equivalent 189) | 2,100 g |
| 1,1,3-tris(2-methyl-4-hydroxy-5-t-butylphenyl)butane | 140 g |
| xylene | 220 ml |

The above ingredients were charged into a 3-liter separable flask, and 42 ml of an aqueous solution containing 0.42 g of tetramethyl ammonium chloride was added.

The mixture was heated with stirring in an atmosphere of nitrogen. Pressure reduction was started when the temperature was elevated to 100° C., and xylene and water were removed.

The pressure was then returned to atmospheric pressure, and in a nitrogen atmosphere, the mixture was reacted at 140° C. for 6 hours. There was obtained 2,240 g of a pale yellow viscous resin having an epoxy equivalent of 240.

One hundred parts by weight of the resulting resin was mixed under heat with 67 parts by weight of methyltetrahydrophthalic anhydride (HN2200, a product of Hitachi Chemical Industry, Co., Ltd.) and 0.5 part by weight of benzylidimethylamine, and the mixture was cast in a mold. The molded product was cured stepwise at 100° C. for 2 hours and then at 150° C. for 4 hours.

The cured product had a heat distortion temperature of 128° C.

EXAMPLE 2

When 280 g of 1,1,3-tris(2-methyl-4-hydroxy-5-t-butylphenyl)butane was used in Example 1, 2,380 g of a resin having an epoxy equivalent of 295 was obtained. One hundred parts by weight of the resulting resin were mixed under heat with 57 parts by weight of methyltetrahydrophthalic anhydride (HN2200) and 0.5 part by weight of benzyldimethylamine, and the mixture was heat-cured in the same way as in Example 1.

The cured product had a heat distortion temperature of 132° C.

EXAMPLE 3

In Example 1, the epoxy resin was reacted in the same way with 75 g of tris(4-hydroxyphenyl)methane instead of 1,1,3-tris(2-methyl-4-hydroxy-5-t-butylphenyl)butane. There was obtained 2,175 g of an epoxy resin having an epoxy equivalent of 236. One hundred parts by weight of the resulting resin was mixed under heat with 68 parts by weight of methyltetrahydrophthalic anhydride (HN2200) and 0.5 part by weight of benzyldimethylamine, and the mixture was heat-cured in the same way as in Example 1.

The cured product had a heat distortion temperature of 126° C.

EXAMPLE 4

| | |
|---|---|
| bisphenol A-type epoxy resin (epoxy equivalent 189) | 790 g |
| tetrabromobisphenol A-type epoxy resin (bromine content 46% by weight, epoxy equivalent 367) | 910 g |
| 1,1,3-tris(2-methyl-4-hydroxy-5-t-butylphenyl)butane | 300 g |
| xylene | 200 ml |

The above ingredients were charged into a 3-liter separable flask, and 40 ml of an aqueous solution containing 0.4 g of tetramethyl ammonium chloride was added. The mixture was reacted as in Example 1, and then cooled to about 100° C.

Methyl ethyl ketone (500 g) was gradually added to the reaction mixture to dilute it to a resin concentration of about 80%. As a result, 2,500 g of a methyl ethyl ketone solution of an epoxy resin (bromine content about 21% by weight) having an epoxy equivalent of 410 was obtained.

One hundred parts (as solids) of the epoxy resin solution was mixed with 4.7 parts by weight of dicyandiamide, 14 parts by weight of methyl Cellosolve, 15 parts by weight of N,N-dimethylformamide and 0.2 part by weight of benzyldimethylamine to prepare an epoxy resin composition in the form of a varnish.

The varnish was impregnated in glass cloths (WE-18K, a product of Nitto Boseki K.K., treated with epoxysilane) and heated at 150° C. for 5 minutes to produce prepregs. Nine such prepregs were stacked and then consolidated at a temperature of 170° C. under a pressure of 10 Kgf/cm$^2$ for 90 minutes to form a laminated plate having a thickness of 1.6 mm.

The laminated plate had a glass transition temperature (Tg), measured by a differential scanning calorimeter (DSC), of 157° C.

The laminated plate had a flexural strength of 48 Kg.f/mm$^2$ at 20° C. and 20 Kg.f/mm$^2$ at 150° C., and the retention of the flexural strength at 150° C. was more than 40%.

The laminated plate had a volume resistivity at 150° C. of $1.0 \times 10^{-12}$ ohm-cm.

EXAMPLE 5

| | |
|---|---|
| bisphenol A-type epoxy resin (epoxy equivalent 189) | 660 g |
| tetrabromobisphenol A-type epoxy resin (bromine content 46% by weight, epoxy equivalent 367) | 946 g |
| 1,1,3-tris(2-methyl-4-hydroxy-5-t-butylphenyl)butane | 376 g |

The above ingredients were reacted as in Example 3, and the reaction mixture was diluted to a resin concentration of about 80% with 496 g of methyl ethyl ketone.

As a result, there was obtained 2,478 g of a methyl ethyl ketone solution of an epoxy resin (bromine content about 22% by weight) having an epoxy equivalent of 503.

A laminate was produced as in Example 3 except that the above epoxy resin solution (solids content 100 parts by weight) and 4 parts by weight of dicyandiamide were used.

The laminated plate had a glass transition temperature (Tg) of 153° C.

The laminated plate had a flexural strength of 20 Kg.f/mm$^2$ at 150° C. and 46 Kg.f/mm$^2$ at 20° C. The retention of the flexural strength at 150° C. was more than 40%.

The laminated plate had a volume resistivity at 150° C. of $3.0 \times 10^{-12}$ ohm-cm.

COMPARATIVE EXAMPLE 1

| | |
|---|---|
| bisphenol A-type epoxy resin (epoxy equivalent 189) | 80 parts by weight |
| methyltetrahydrophthalic anhydride (HN2200) | 87 parts by weight |
| benzyldimethylamine | 0.5 parts by weight |

The above ingredients were mixed and cured in the same way as in Example 1. The cured product had a heat distortion temperature of 115° C.

COMPARATIVE EXAMPLE 2

When in Example 1, 155 g of bisphenol A was used instead of 1,1,3-tris(2-methyl-4-hydroxy-5-t-butylphenyl)butane, 2,255 g of an epoxy resin having an epoxy equivalent of 237 was obtained.

One hundred parts by weight of the resulting epoxy resin was mixed with 67 parts by weight of methyltetrahydrophthalic anhydride (HN2200) and 0.5 part by weight of benzyldimethylamine, and heat-cured in the same way as in Example 1.

The cured product had a heat distortion temperature of 120° C.

COMPARATIVE EXAMPLE 3

| | |
|---|---|
| bisphenol A-type epoxy resin (epoxy equivalent 189) | 1,310 g |
| tetrabromobisphenol A | 720 g |

Except using the above ingredients, the same reaction as in Example 1 was carried out. The reaction mixture was diluted with a resin concentration of about 80% with 508 g of methyl ethyl ketone.

As a result, there was obtained 2,538 g of a methyl ethyl ketone solution of an epoxy resin (bromine content about 21% by weight) having an epoxy equivalent of 480.

A laminated plate was produced in the same way as in Example 3 except that the epoxy resin solution (100 parts by weight as solids) was mixed with 4 parts by weight of dicyandiamide.

The resulting laminated plate had a glass transition temperature (Tg) of 123° C.

The laminated plate had a flexural strength of 48 Kg.f/mm² at 20° C. and 10 Kg.f/mm² at 150° C., and the retention of the flexural strength at 150° C. was 21%.

The laminated sheet had a volume resistivity of $1.3 \times 10^{10}$ ohm-cm.

The results obtained in the above Examples and Comparative Examples are summarized in Table 1.

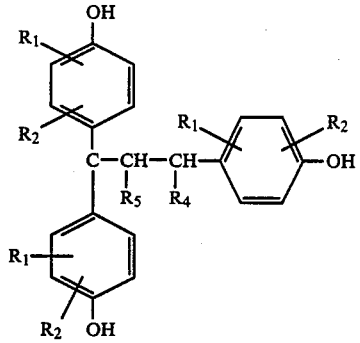

wherein each of $R_1$ and $R_2$ represents hydrogen or an alkyl group having not more than 6 carbon atoms with the proviso that at least one of them is the alkyl group, and each of $R_3$, $R_4$ and $R_5$ represents hydrogen or an alkyl group having not more than 4 carbon atoms, with an epoxy resin selected from the group consisting of (B) a bisphenol epoxy resin, (C) a halogen-containing epoxy resin and mixtures thereof, the number of the phenolic hydroxyl groups of the compound (A) being 0.03 to 0.7 per epoxy group of the epoxy resin.

2. The epoxy resin composition of claim 1 wherein the compound (A) is 1,1,3-tris(2-methyl-4-hydroxy-5-t-butylphenyl)butane.

3. The epoxy resin composition of claim 1 wherein the bisphenol epoxy resin (B) is present and is an epoxy resin having an epoxy equivalent of 170 to 500 obtained by the reaction of bisphenol A with epichlorohydrin.

4. The epoxy resin composition of claim 1 wherein the halogen-containing epoxy resin (C) is present and is the reaction product of bromine-containing bisphenol A with epichlorohydrin, which product has a bromine content of 30 to 50% by weight and an epoxy equivalent of 328 to 2,000.

5. The epoxy resin composition of claim 1 which has an epoxy equivalent of 200 to 1,800.

6. The epoxy resin composition of claim 1 which has a halogen (bromine) content of 15 to 30% by weight.

7. A laminated plate obtained by consolidating under heat and pressure prepregs composed of a reinforcing fibrous base material and a combination of an epoxy resin and a curing agent impregnated in the base material, said epoxy resin being an epoxy resin composition comprising the reaction product of (A) a compound

TABLE 1

| | Ex. (= Example), Com. (= Comparative Example) | | | | | | | |
|---|---|---|---|---|---|---|---|---|
| | Ex. 1 | Ex. 2 | Ex. 3 | Com. 1 | Com. 2 | Ex. 4 | Ex. 5 | Com. 3 |
| bisphenol A-type epoxy | 2100 | 2100 | 2100 | 100 | 2100 | 790 | 660 | 1310 |
| tetrabromobisphenol A-type epoxy resin | — | — | — | — | — | 910 | 946 | — |
| trisphenol | 140 | 280 | 75 | — | — | 300 | 376 | — |
| bisphenol A | — | — | — | — | 155 | — | — | — |
| tetrabromobisphenol A | — | — | — | — | — | — | — | 720 |
| epoxy equivalent | 240 | 295 | 236 | 189 | 237 | 410 | 503 | 480 |
| Heat distortion temperature of the cured product (°C.) | 128 | 132 | 126 | 115 | 120 | | | |
| Properties of the laminated plate | | | | | | | | |
| Glass transition temperature | | | | | | 157 | 153 | 123 |
| Flexural Strength | | | | | | | | |
| at 20° C. (Kgf/mm²) | | | | | | 48 | 46 | 48 |
| at 150° C. (Kgf/mm²) | | | | | | 20 | 20 | 10 |
| retention (%) | | | | | | >40 | >40 | 21 |
| Volume resistivity (ohm-cm) | | | | | | $1.0 \times 10^{12}$ | $3.0 \times 10^{12}$ | $1.3 \times 10^{10}$ |

What is claimed is:

1. An epoxy resin composition comprising the reaction product of (A) a compound having three phenolic hydroxyl groups in the molecule represented by the following general formula:

having three phenolic hydroxyl groups in the molecule represented by the following general formula:

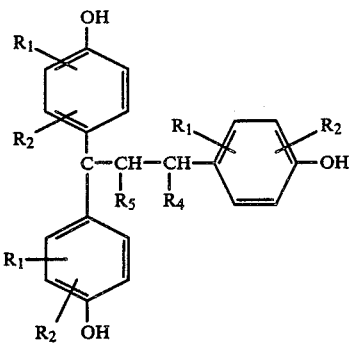

wherein each of $R_1$ and $R_2$ represents hydrogen or an alkyl group having not more than 6 carbon atoms with the proviso that at least one of them is the alkyl group, and each of $R_3$, $R_4$ and $R_5$ represents hydrogen or an alkyl group having not more than 4 carbon atoms, with an epoxy resin selected from the group consisting of (B) a bisphenol epoxy resin, (C) a halogen-containing epoxy resin and mixtures thereof, the number of the phenolic hydroxyl groups of the compound (A) being 0.03 to 0.7 per epoxy group of the epoxy resin, and said laminate having a glass transition temperature (Tg), measured by a differential scanning calorimeter, of at least 150° C.

8. The epoxy resin composition of claim 1 in which the number of phenolic hydroxyl groups of the compound (A) is from 0.05 to 0.6 per epoxy group of the epoxy resin.

9. The epoxy resin composition of claim 1 in which in the formula $R_4$ is a methyl group and $R_5$ is hydrogen.

10. The epoxy resin composition of claim 1 in which in the formula $R_3$ represents a methyl or ethyl group.

* * * * *